United States Patent
Yin et al.

(10) Patent No.: US 7,109,799 B2
(45) Date of Patent: Sep. 19, 2006

(54) CURRENT-CONTROLLED CMOS WIDEBAND DATA AMPLIFIER CIRCUITS

(75) Inventors: Guangming Yin, Foothill Ranch, CA (US); Jun Cao, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 6 days.

(21) Appl. No.: 10/618,462

(22) Filed: Jul. 11, 2003

(65) Prior Publication Data

US 2004/0056717 A1    Mar. 25, 2004

Related U.S. Application Data

(63) Continuation of application No. 10/028,806, filed on Oct. 25, 2001, now Pat. No. 6,624,699.

(51) Int. Cl.
H03F 3/45 (2006.01)
H03F 1/14 (2006.01)
H03F 3/04 (2006.01)

(52) U.S. Cl. .................. 330/260; 330/292; 330/302; 330/310

(58) Field of Classification Search ............... 330/260, 330/292, 302, 310
See application file for complete search history.

(56) References Cited

U.S. PATENT DOCUMENTS

| | | | |
|---|---|---|---|
| 4,449,248 A | 5/1984 | Leslie et al. | |
| 4,519,068 A | 5/1985 | Krebs et al. | |
| 4,545,023 A | 10/1985 | Mizzi | |
| 4,680,787 A | 7/1987 | Marry | |
| 4,731,796 A | 3/1988 | Masterton et al. | |

(Continued)

FOREIGN PATENT DOCUMENTS

WO    WO 0163767    8/2001

OTHER PUBLICATIONS

Leung D L C et al: "A 3–V CMOS differential bandpass amplifier for GSM receivers" Circuits and Systems, 1998, ISCAS '98, Proceedings of the 1998 IEEE International Symposium on Monterey, CA USA May 31–Jun. 3, 1998, New York, NY, USA, IEEE, US, May 31, 1998, pp. 341–344, XPO10289447 ISBN: 0–7803–4455–3 "figure 5".
Diang Li et al Institute of Electrical and Electronic Engineers: RF circuit performance degradation due to soft breakdown and hot cemer effect in 0 18/sp mu/m CMOS technology 2001 IEEE Radio Frequency Integrated Circuits (RFIC) Symposium Digest of Papers, Phoenix, AZ, May 20–22, 2001, IEEE Radio Frequency Integrated Circuits Symposium, New York, NY IEEE, US, May 20, 2001 pp. 139–142, XP010551338 ISBN 0–7803–6601–8 "figure 3".
Razavi B Ed–Institute of Electrical and Electronics Engineers "Prospects of CMOS Technology For High—Spaced Optical Communication Circuits" GaAs IC symposium, 23rd Annual IEEE Gallium Arsenide Integrated Circuit Symposium, Technical digest 2001, Baltimore, MD, Oct. 21–24, 2001, GaAs IC Symposium–IEEE Gallium Arsenide Integrated Circuit Symposium, New York, NY IEEE, US, Oct. 21, 2001, pp. 3–6, XP001O46946 ISBN: 0–7803–6683–8 figures 6a, 7.

(Continued)

*Primary Examiner*—Patricia Nguyen
(74) *Attorney, Agent, or Firm*—Garlick Harrison & Markison; Shayne X. Short

(57) ABSTRACT

Expansion of the bandwidth of a wideband CMOS data amplifier is accomplished using various combinations of shunt peaking, series peaking, and miller capacitance cancellation. These various combinations are employed in any of the amplifier input stage, in intermediate stages, or in the last stage.

29 Claims, 12 Drawing Sheets

U.S. PATENT DOCUMENTS

| | | | |
|---|---|---|---|
| 4,737,975 A | 4/1988 | Shafer | |
| 4,761,822 A | 8/1988 | Maile | |
| 4,777,657 A | 10/1988 | Gillaspie | |
| 4,794,649 A | 12/1988 | Fujiwara | |
| 4,804,954 A | 2/1989 | Macnak et al. | |
| 4,807,282 A | 2/1989 | Kazan et al. | |
| 4,817,115 A | 3/1989 | Campo et al. | |
| 4,850,009 A | 7/1989 | Zook et al. | |
| 4,885,548 A * | 12/1989 | Wakimoto et al. | 330/260 |
| 4,890,832 A | 1/1990 | Komaki | |
| 4,894,792 A | 1/1990 | Mitchell et al. | |
| 4,916,441 A | 4/1990 | Gombrich | |
| 4,964,121 A | 10/1990 | Moore | |
| 4,969,206 A | 11/1990 | Desrochers | |
| 4,977,611 A | 12/1990 | Maru | |
| 4,995,099 A | 2/1991 | Davis | |
| 5,008,879 A | 4/1991 | Fischer et al. | |
| 5,025,486 A | 6/1991 | Klughart | |
| 5,029,183 A | 7/1991 | Tymes | |
| 5,031,231 A | 7/1991 | Miyazaki | |
| 5,033,109 A | 7/1991 | Kawano et al. | |
| 5,055,659 A | 10/1991 | Hendrick et al. | |
| 5,055,660 A | 10/1991 | Bertagna et al. | |
| 5,081,402 A | 1/1992 | Koleda | |
| 5,087,099 A | 2/1992 | Stolarczyk | |
| 5,117,501 A | 5/1992 | Childress et al. | |
| 5,119,502 A | 6/1992 | Kallin et al. | |
| 5,121,408 A | 6/1992 | Cai et al. | |
| 5,123,029 A | 6/1992 | Bantz et al. | |
| 5,128,938 A | 7/1992 | Borras | |
| 5,134,347 A | 7/1992 | Koleda | |
| 5,142,573 A | 8/1992 | Umezawa | |
| 5,150,361 A | 9/1992 | Wieczorek et al. | |
| 5,152,006 A | 9/1992 | Klaus | |
| 5,153,878 A | 10/1992 | Krebs | |
| 5,175,870 A | 12/1992 | Mabey et al. | |
| 5,179,721 A | 1/1993 | Comroe et al. | |
| 5,181,200 A | 1/1993 | Harrison | |
| 5,230,084 A | 7/1993 | Nguyen | |
| 5,239,662 A | 8/1993 | Danielson et al. | |
| 5,241,542 A | 8/1993 | Natarajan et al. | |
| 5,241,691 A | 8/1993 | Owen | |
| 5,249,220 A | 9/1993 | Moskowitz et al. | |
| 5,249,302 A | 9/1993 | Metroka et al. | |
| 5,265,238 A | 11/1993 | Canova, Jr. et al. | |
| 5,265,270 A | 11/1993 | Stengel et al. | |
| 5,274,666 A | 12/1993 | Dowdell et al. | |
| 5,276,680 A | 1/1994 | Messenger | |
| 5,278,831 A | 1/1994 | Mabey et al. | |
| 5,289,469 A | 2/1994 | Tanaka | |
| 5,291,516 A | 3/1994 | Dixon et al. | |
| 5,293,639 A | 3/1994 | Wilson et al. | |
| 5,296,849 A | 3/1994 | Ide | |
| 5,297,144 A | 3/1994 | Gilbert et al. | |
| 5,323,392 A | 6/1994 | Ishii et al. | |
| 5,349,649 A | 9/1994 | Iijima | |
| 5,361,397 A | 11/1994 | Wright | |
| 5,363,121 A | 11/1994 | Freund | |
| 5,373,149 A | 12/1994 | Rasmussen | |
| 5,373,506 A | 12/1994 | Tayloe et al. | |
| 5,390,206 A | 2/1995 | Rein et al. | |
| 5,392,023 A | 2/1995 | D'Avello et al. | |
| 5,406,615 A | 4/1995 | Miller, II et al. | |
| 5,406,643 A | 4/1995 | Burke et al. | |
| 5,418,837 A | 5/1995 | Johansson et al. | |
| 5,423,002 A | 6/1995 | Hart | |
| 5,426,637 A | 6/1995 | Derby et al. | |
| 5,428,636 A | 6/1995 | Meier | |
| 5,430,845 A | 7/1995 | Rimmer et al. | |
| 5,438,329 A | 8/1995 | Gastouniotis et al. | |
| 5,440,560 A | 8/1995 | Rypinski | |
| 5,465,081 A | 11/1995 | Todd | |
| 5,481,265 A | 1/1996 | Russell | |
| 5,481,562 A | 1/1996 | Pearson et al. | |
| 5,533,029 A | 7/1996 | Gardner | |
| 5,535,373 A | 7/1996 | Oinowich | |
| 5,544,222 A | 8/1996 | Robinson et al. | |
| 5,579,487 A | 11/1996 | Meyerson et al. | |
| 5,584,048 A | 12/1996 | Wieczorek | |
| 5,628,055 A | 5/1997 | Stein | |
| 5,630,061 A | 5/1997 | Richter et al. | |
| 5,680,633 A | 10/1997 | Koenck et al. | |
| 5,732,346 A | 3/1998 | Lazaridis et al. | |
| 5,740,366 A | 4/1998 | Mahany et al. | |
| 5,744,366 A | 4/1998 | Kricka et al. | |
| 5,793,551 A * | 8/1998 | Ngo et al. | 360/67 |
| 5,796,727 A | 8/1998 | Harrison et al. | |
| 5,839,051 A | 11/1998 | Grimmett et al. | |
| 5,940,771 A | 8/1999 | Gollnick et al. | |
| 6,014,705 A | 1/2000 | Koenck et al. | |
| 6,194,972 B1 * | 2/2001 | Brown | 331/108 B |
| 6,259,321 B1 * | 7/2001 | Song et al. | 330/254 |
| 6,340,899 B1 * | 1/2002 | Green | 326/115 |
| 6,366,166 B1 * | 4/2002 | Belot | 330/252 |
| 6,374,311 B1 | 4/2002 | Mahany et al. | |
| 6,414,558 B1 * | 7/2002 | Ryan et al. | 331/78 |
| 6,417,737 B1 * | 7/2002 | Moloudi et al. | 330/301 |
| 6,424,194 B1 | 7/2002 | Hairapetian | |
| 6,774,721 B1 * | 8/2004 | Popescu et al. | 330/253 |
| 6,774,722 B1 * | 8/2004 | Hogervorst | 330/258 |
| 6,864,558 B1 * | 3/2005 | Momtaz et al. | 257/531 |

OTHER PUBLICATIONS

Li Q et al: "RF Circuit Performance Degradation Due to Soft Breakdown adn Hot–Carrier Effect in Deep–Submicrometer CMOS Technology" IEEE Transactions on Microwave, Theory and Techniques, IEEE Inc. New York, US, vol. 49, No. 9, Sep. 2001, XP001096604 ISSN: 0018–9480 "figure 9".

Bida, A Hybrid Wireless MAC Protocol Supporting Asynchronous and Synchronous MSDU Delivery Services, IEEE 802.11/91–92, Sep. 1991, pp. 1–46.

Robert Meier's Master's Thesis, Mobile Computer Network Architecture, (May 1993), 82 pages.

Hoberecht, A Layered network Protocol for Packet Voice and Data Integration, IEEE Journal on Selected Areas in Communications, vol. SAC–1, No. 6 (Dec. 1983), pp. 1006–1013.

Rypinski, Architecture–Topology and Protocol Stacks, IEEE 802.11/91–21, Mar. 1991, 12 pages.

Cheah, A Proposed Architecture and Access Protocol Outline for the IEEE 802.11 Radio LAN Standards, Document IEEE P802.11/91–54, May 1991; pp. 1–20.

Rypinski, Power–Drain Considerations for Full Time and Sleep Mode Radio Receivers, IEEE P802.11/91–99, Sep. 1991, 11 pages.

Natarajan et al, Battery Efficient Operation of Radio MAC Protocol, IEEE P802.11/91–102, Sep. 1991, pp. 1–5.

Cox, A Radio System Proposal for Widespread Low–Power Tetherless Communications, IEEE Transactions on Communications, vol. 39, No. 2 (Feb. 1991), pp. 324–335.

Bagby, One Approach to Wireless Network Architecture, IEEE P802.11/91–2, Jan. 1991, 1–15, 17–21.

Biba, A Modest Proposal for a Asynchronous, Data Intensive, Wireless Local Area Network, IEEE P802.11/91–25, Mar. 1991; pp. 1–25.

Heimschi et al; Merget CMOS/Bipolar Current Switch Logic (MSCL), IEEE Journal of Solid State Circuits, vol. 24, pp. 1307–1311, Oct. 1989, pp. 1307–1311.

Elrabaa et al; Optimization of Digital BiCMOS Circuits, An Overview, IEEE 1992, 5 pages.

Mudd et al, Very High Speed ECL/CMG Gate Arrays with Submicron Structures; IEEE 1989, 5 pages.

* cited by examiner

CURRENT-CONTROLLED CMOS WIDEBAND DATA AMPLIFIER CIRCUITS

This application is a continuation of U.S. patent application Ser. No. 10/028,806 filed Oct. 25, 2001, now U.S. Pat. No. 6,624,699.

BACKGROUND OF THE INVENTION

1. Field of the Invention

The present invention pertains to the field of complementary metal-oxide-semiconductor (CMOS) circuitry; and, specifically, to the field of high speed CMOS wideband data amplifiers for wideband data communication applications.

2. Discussion of the Related Art

High speed wideband data amplifiers are used in wideband data communication applications. For a number of reasons including speed limitations of processing technology, power consumption and other cost related concerns, it is desirable to develop efficient techniques to boost the amplifier bandwidth for higher frequency operations. High speed circuit techniques such as current-controlled CMOS (or $C^3MOS$) logic have been developed that have brought about marked increase in the speed of circuitry fabricated using standard CMOS process technology. Various $C^3MOS$ circuit techniques are described in greater detail in commonly-assigned patent application Ser. No. 09/484,856, titled "Current Controlled CMOS Logic Family," by A. Hairapetian, which is hereby incorporated by reference in its entirety.

Other techniques have been developed to increase the gain-bandwidth product of CMOS circuitry. For example, shunt peaking is one approach that has resulted in improved gain-bandwidth product. Shunt peaking involves putting an inductor in series with the output resistor to expand the bandwidth of the circuit. Such inductive broadbanding technique combined with $C^3MOS$ circuitry has been described in greater detail in commonly-assigned patent application Ser. No. 09/610,905, titled "Current-Controlled CMOS Circuits with Inductive Broadbanding," by M. Green, which is hereby incorporated by reference in its entirety. The expansion of the gain-bandwidth product brought about by such inductive peaking, however, is limited to about 1.5 times, and the inductors needed are generally large which requires a large area on an integrated circuit. In wideband data communications, the usable data frequency range starts at several kilohertz and extends all the way up to many gigahertz. A wideband amplifier is required to handle such a broad spectrum of data frequencies. This is in contrast to the wireless domain where communications occurs only over a narrow band, which can be accomplished using a tuned amplifier with an inductor and a capacitor. However, a relatively constant or flat frequency response is desired over a wide frequency band in a wideband data amplifier.

Typically, in designing a wideband amplifier there is a trade off between gain and bandwidth. The product of gain and bandwidth is usually a constant for the same topology. However, by using special techniques, bandwidth can be extended while maintaining the same gain level. One conventional way is to employ a faster process technology, such as GaAs or InP when fabricating integrated circuits upon which the wideband data amplifier is implemented. However, these technologies are generally more costly and not as widely available as standard CMOS process.

As is apparent from the above discussion, a need exists for widening the high gain portion of the frequency response of the amplifier without compromising the gain, for minimizing the power consumption of the amplifier, and for eliminating expensive process requirements.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

This invention achieves maximum bandwidth expansion by using series inductor peaking with miller capacitance cancellation technique and shunt inductor peaking in current controlled CMOS circuit ($C^3MOS$). The series peaking provides a certain peak bandwidth product depending on the inductance L, the capacitance C, and the quality of these two components. The bandwidth is inversely proportional to the square root of LC. The peaking mainly depends upon the inductance due to its limited Q. By reducing the miller capacitance from the $C^3MOS$ input a wider bandwidth is obtained with adequate peaking value. The total response of the amplifier can be obtained with wider bandwidth of minimum ripple and minimum phase distortion.

According to the present invention, an amplifier stage includes a current source (preferably a biased transistor), first and second differential transistors coupled to the current source, first and second series peaking inductors coupled to the gates of the first and second differential transistors, respectively, a first output resistor and a first shunt peaking inductor connected in series and coupled to the drain of the first differential transistor, and a second output resistor and a second shunt peaking inductor connected in series and coupled to the drain of the second differential transistor.

According to another aspect of the present invention, first and second miller capacitance cancellation capacitors are cross-coupled between the drains and gates of the first and second differential transistors.

According to yet another aspect of the present invention, a multi-stage differential amplifier includes serial peaking and shunt peaking in the various stages of the multi-stage differential amplifier. According to another aspect of the present invention, miller capacitance cancellation is employed in the various stages of the multi-stage differential amplifier. The serial peaking, shunt peaking, and miller capacitance cancellation can be combined in any of various combinations throughout the various stages of the multi-stage differential amplifier. In an embodiment, the serial peaking, shunt peaking, and miller capacitance cancellation are all combined in the first stage of the multi-stage differential amplifier.

These and other features, aspects, and advantages of the present invention will be apparent from the Detailed Description of the Invention and Figures.

The Figures are more fully explained in the Detailed Description of the Invention.

DETAILED DESCRIPTION OF THE INVENTION

According to an embodiment of the present invention, shunt peaking, and serial peaking are combined in the same wideband data amplifier. In various embodiments of a multi-stage wideband data amplifier, some stages may have serial peaking but not shunt peaking, other stages may have shunt peaking but not serial peaking, other stages may have serial peaking and shunt peaking, and yet other stages may have neither serial peaking nor shunt peaking.

Figure 1:
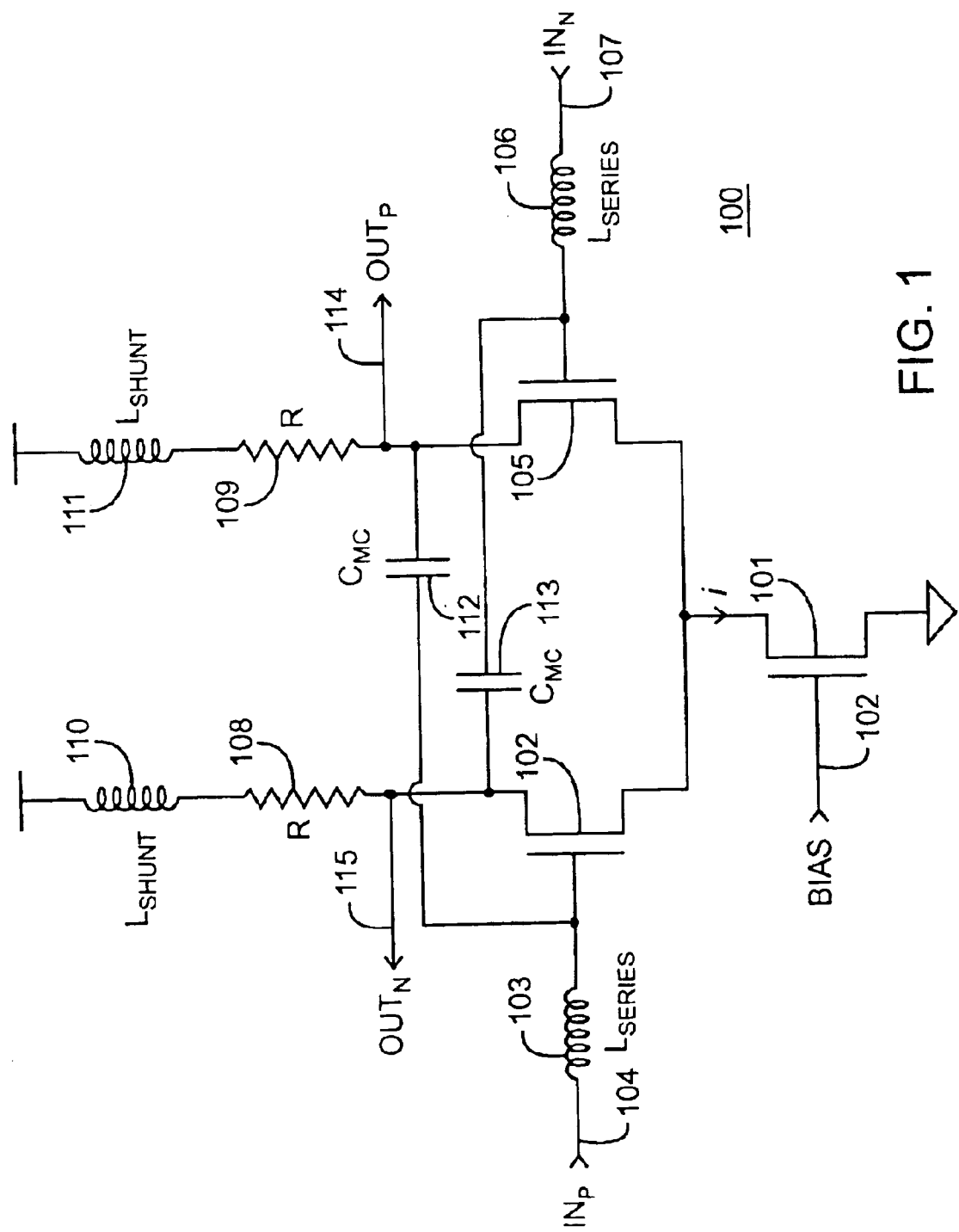
FIG. 1 illustrates an amplifier stage according to one embodiment of the present invention having series peaking, shunt peaking, and miller capacitance cancellation.

FIG. 1 illustrates an amplifier stage 100 according to one embodiment of the present invention having series peaking, shunt peaking, and miller capacitance cancellation. A current source transistor 101 is biased by a bias voltage so that a constant current i flows from drain to source in the current source transistor 101. A first differential transistor 102 has its gate tied to the negative end of a first series peaking inductor 103, while a positive differential input signal $IN_P$ 104 is coupled to the positive end of the first series peaking inductor 103. Similarly, a second differential transistor 105 has its gate tied to the negative end of a second series peaking inductor 106, while a negative differential input signal $IN_N$ 107 is coupled to the positive end of the second series peaking inductor 106. Assuming that the first and second differential transistors 102 and 105 are identical, then the first and second series peaking inductors 103 and 106 have the same inductance $L_{series}$. A first output resistor 108 has its negative end tied to the drain of the first differential transistor 102, and has its positive end tied to the negative end of a first shunt peaking inductor 110. A second output resistor 109 has its negative end tied to the drain of the second differential transistor 105, and has its positive end tied to the negative end of a second shunt peaking inductor 111. The positive ends of the first and second shunt peaking inductors 110 and 111 are tied to the positive supply voltage. Preferably, the first and second output resistors 108 and 109 have the same resistance value R, and the first and second shunt peaking inductors 110 and 111 have the same inductances Lshunt. Miller cancellation capacitor 112 has its positive end coupled to the drain of the second differential transistor 105, and has its negative end coupled to the gate of the first differential transistor 102. Miller cancellation capacitor 113 has its positive end coupled to the drain of the first differential transistor 102, and has its negative end coupled to the gate of the second differential transistor 105. A first output signal $OUT_P$ 114 is taken at the drain of the second differential transistor 105, and the second output signal $OUT_N$ 115 is taken at the drain of the first differential transistor 102.

Figure 2:
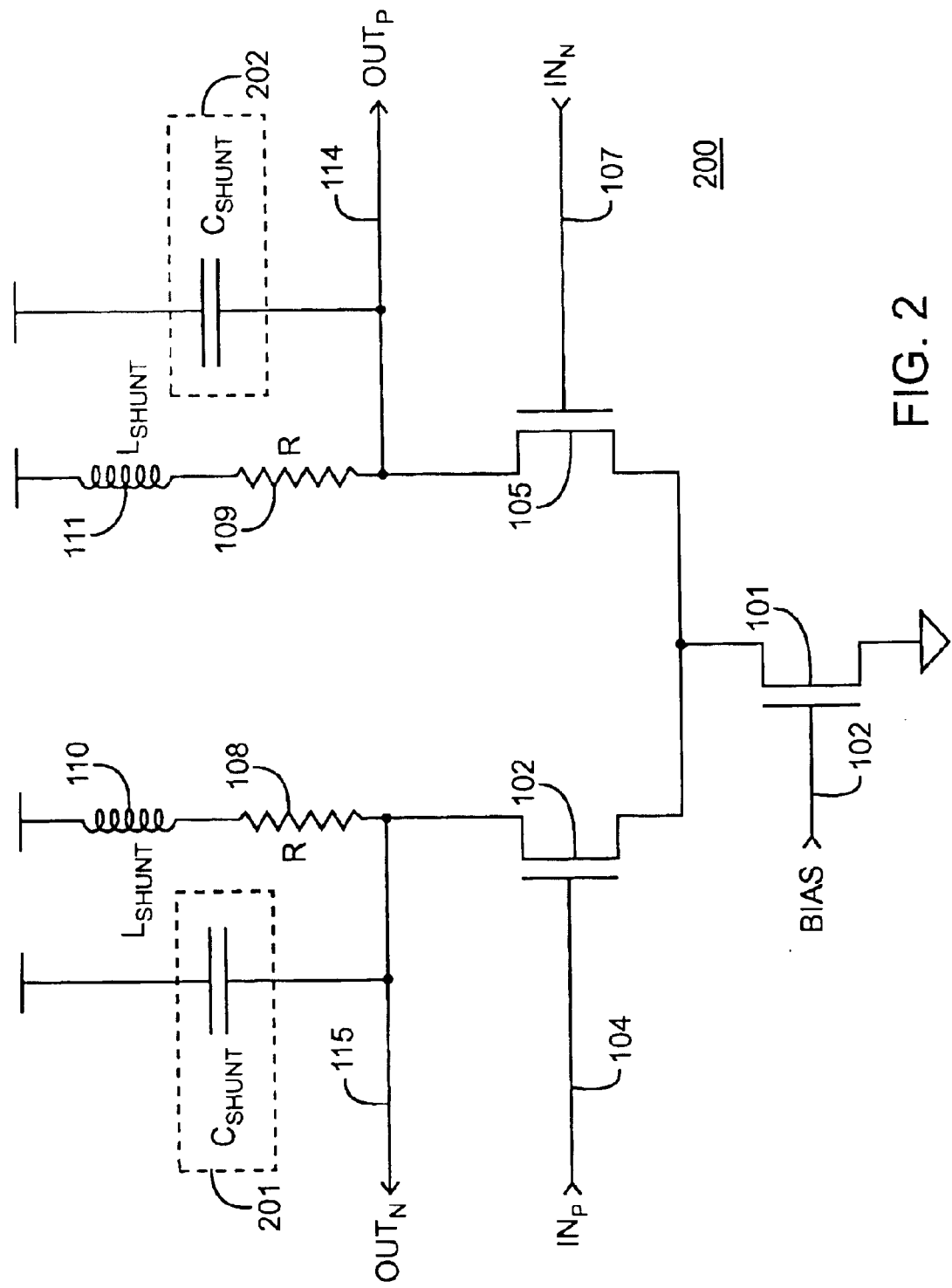
FIG. 2 illustrates an amplifier stage having shunt peaking inductors and parasitic shunt capacitors according to another embodiment of the present invention.

FIG. 2 illustrates an amplifier stage 200 having shunt peaking inductors and parasitic shunt capacitors according to another embodiment of the present invention. A first parasitic shunt capacitance 201 exists between the second output signal $OUT_N$ 115 and the power supply, and a second parasitic shunt capacitance 202 exists between the first output signal $OUT_P$ 114 and the power supply. The first parasitic capacitance 201 and second parasitic capacitance 202 are shown in dotted boxes to indicate that they are not physical circuit elements that are purposefully implemented by design, but rather inherently and parasitically exist on the fabricated circuit. The first output resistor 108, first shunt peaking inductor 110, and first parasitic shunt capacitance 201 form a first resistor-inductor-capacitor (RLC) circuit, and second output resistor 108, second shunt peaking inductor 110, and second parasitic shunt capacitance 201 to form a second RLC circuit. The RLC circuits at the output of the amplifier stage form a conjugate pair of poles in the complex plane, causing peaking of the frequency response to occur prior to roll off.

Figure 3:
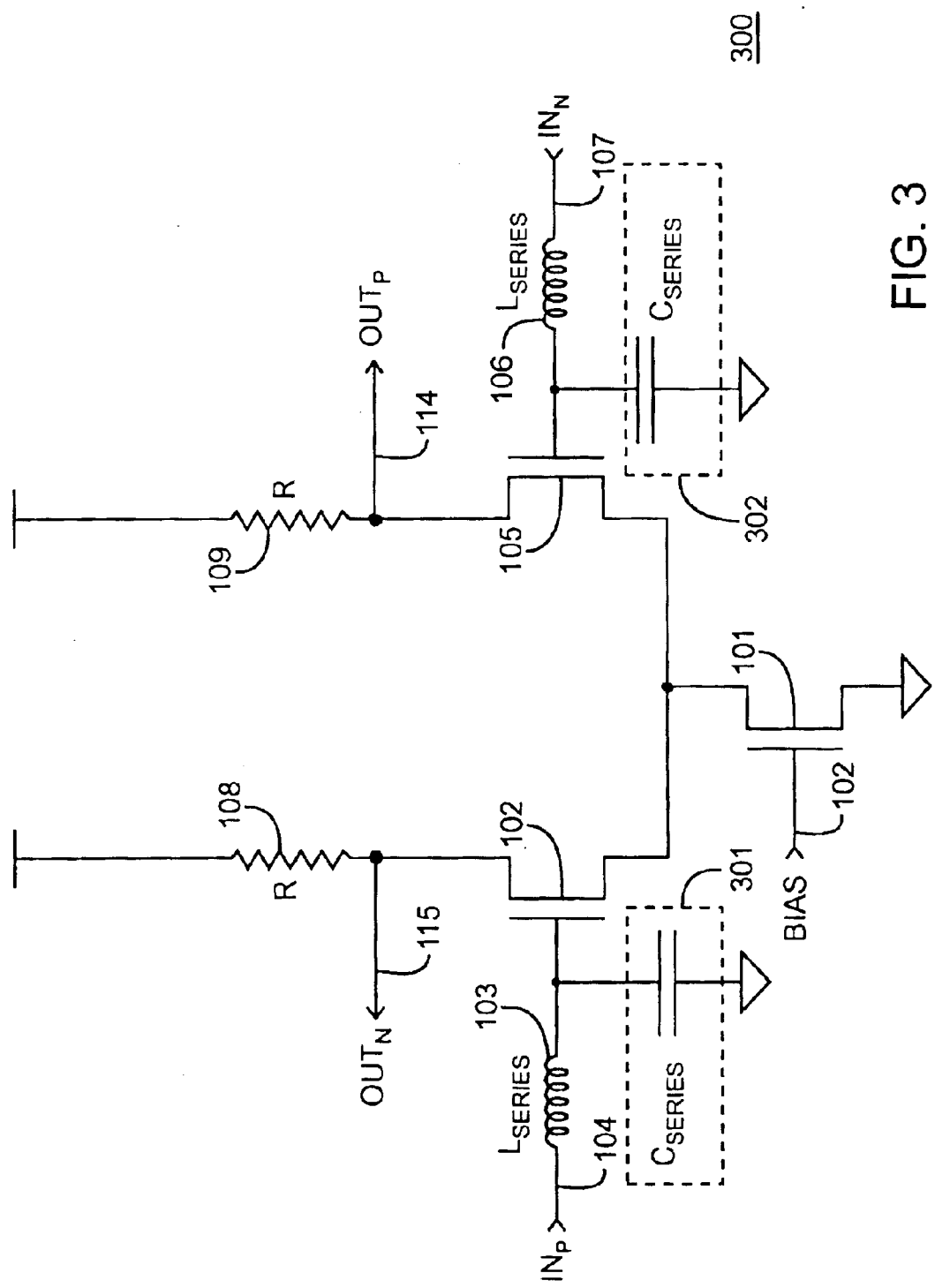
FIG. 3 illustrates an amplifier stage having series peaking inductors and parasitic series capacitors according to yet another embodiment of the present invention.

FIG. 3 illustrates an amplifier stage 300 having series peaking inductors and parasitic series capacitors according to yet another embodiment of the present invention. A first series capacitor 301 exist between the gate of the first differential transistor 102 and ground, and a second series capacitor 302 exists between the gate of the second differential transistor 105 and ground. The first series capacitor 301 and second series capacitor 302 are enclosed in dotted rectangles so as to indicate that they are unavoidable parasitic results of the transistors being formed on a substrate, rather than being purposefully designed into the circuit. The first series peaking inductor 103 and first series capacitor 301 form a first inductor-capacitor (LC) circuit, and the second series peaking inductor 106 and second series capacitor 302 form a second LC circuit. The LC circuits at the input of the amplifier stage form a conjugate pair of poles in the complex plane, causing peaking of the frequency response to occur prior to roll off.

Figure 4:
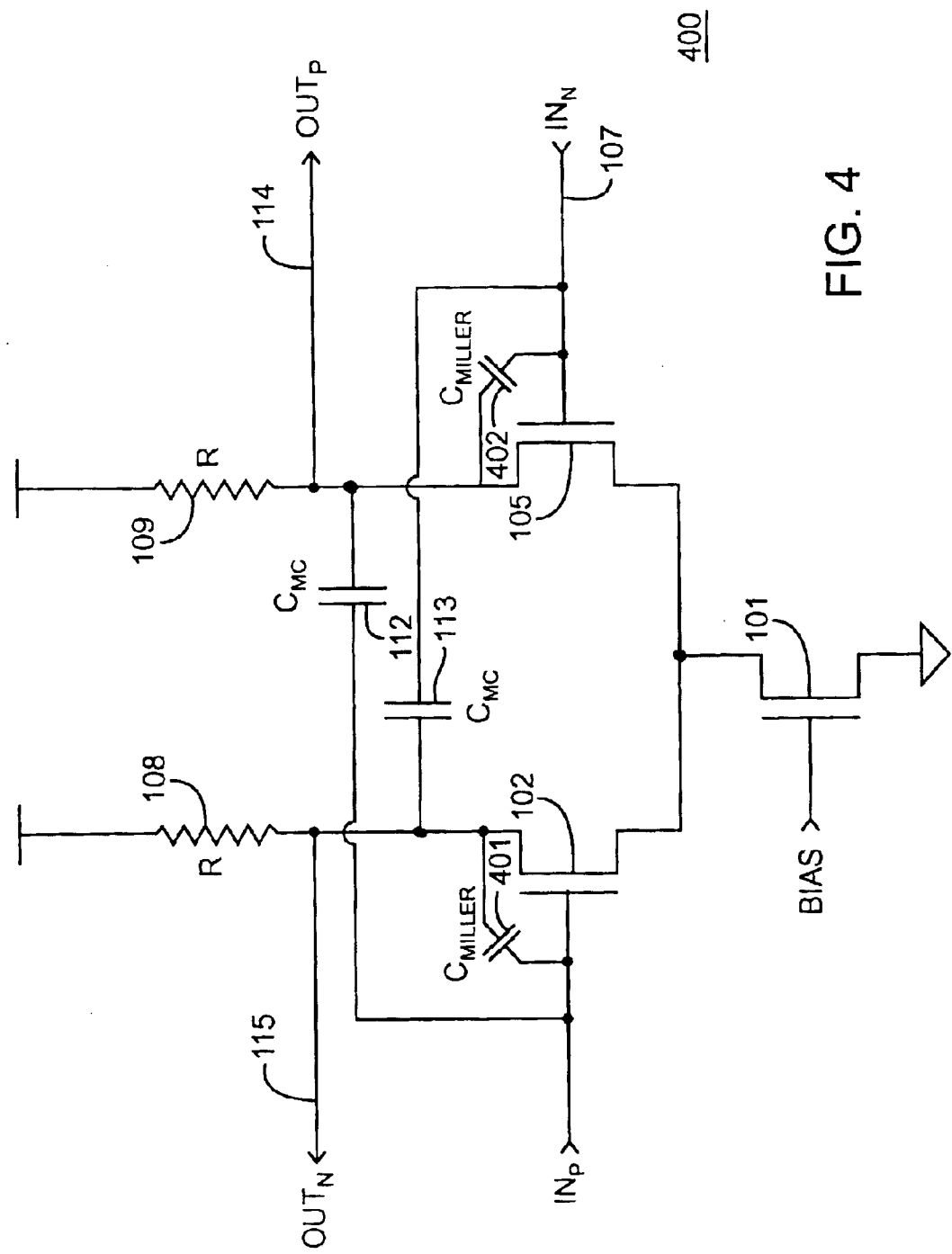
FIG. 4 illustrates an amplifier stage having parasitic miller capacitances and miller capacitance cancellation capacitors.

FIG. 4 illustrates an amplifier stage 400 having miller capacitance cancellation capacitors and parasitic miller capacitances. A first series miller capacitance cancellation capacitor 401 has its positive end coupled to the drain of the first differential transistor 102 and has its negative end coupled to the gate of the first differential transistor 102. A second miller capacitance cancellation capacitor 402 has its positive end coupled to the drain of the second differential transistor and its negative end coupled to the gate of the second differential transistor. The first miller cancellation capacitor 112 cancels the effect of the parasitic first miller capacitance 401 of the first differential transistor 102, and the second miller cancellation capacitor 113 cancels the effect of the parasitic second miller capacitance 402 of the second differential transistor 105.

The wideband data amplifiers according to the present invention are small signal amplifiers. The primary object of the wide band data amplifiers according to the present invention is to have high gain, so as to increase signal strength from input to output. Preferably, the wide band data amplifiers are linear in their small signal transfer function, thus they are linear amplifiers. Each stage in the multi-stage wide band data amplifier according to the present invention presents a pole in the complex plane. Because a wideband data amplifier according to present invention is multi-stage, with each successive stage, the bandwidth from input to output becomes shorter and shorter.

Figure 7:
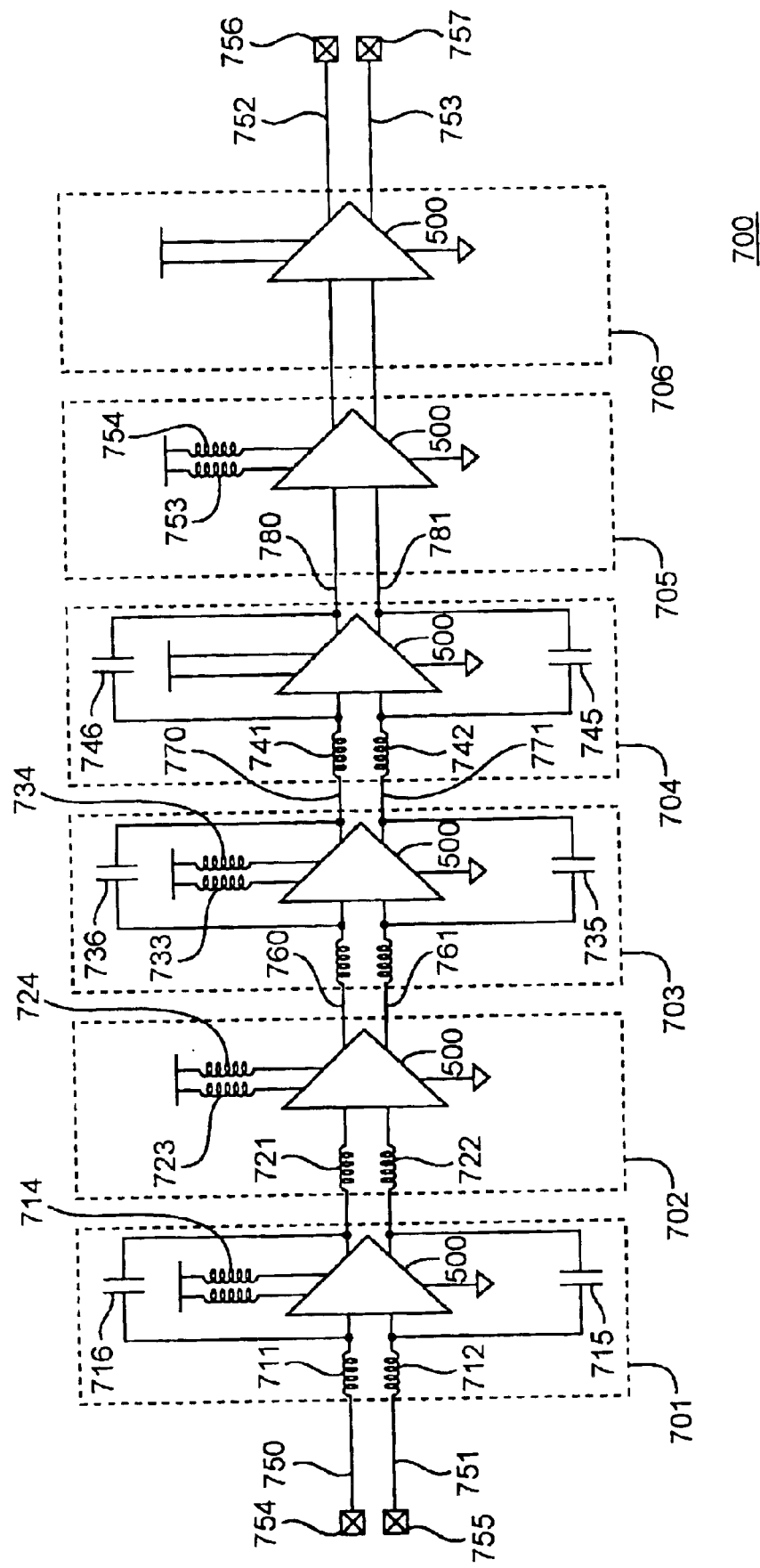
FIG. 7 illustrates a multi-stage amplifier according to an exemplary embodiment of the present invention having series peaking, shunt peaking, and miller capacitance cancellation at various positions of the multi-stage amplifier.

Therefore, it is desirable to create a data amplifier having a bandwidth of around, for example, 10 gigahertz and having about, e.g., 6 stages, as illustrated in FIG. 7. With today's fabrication processes, this is not possible with conventional amplifier stages.

Figure 5:
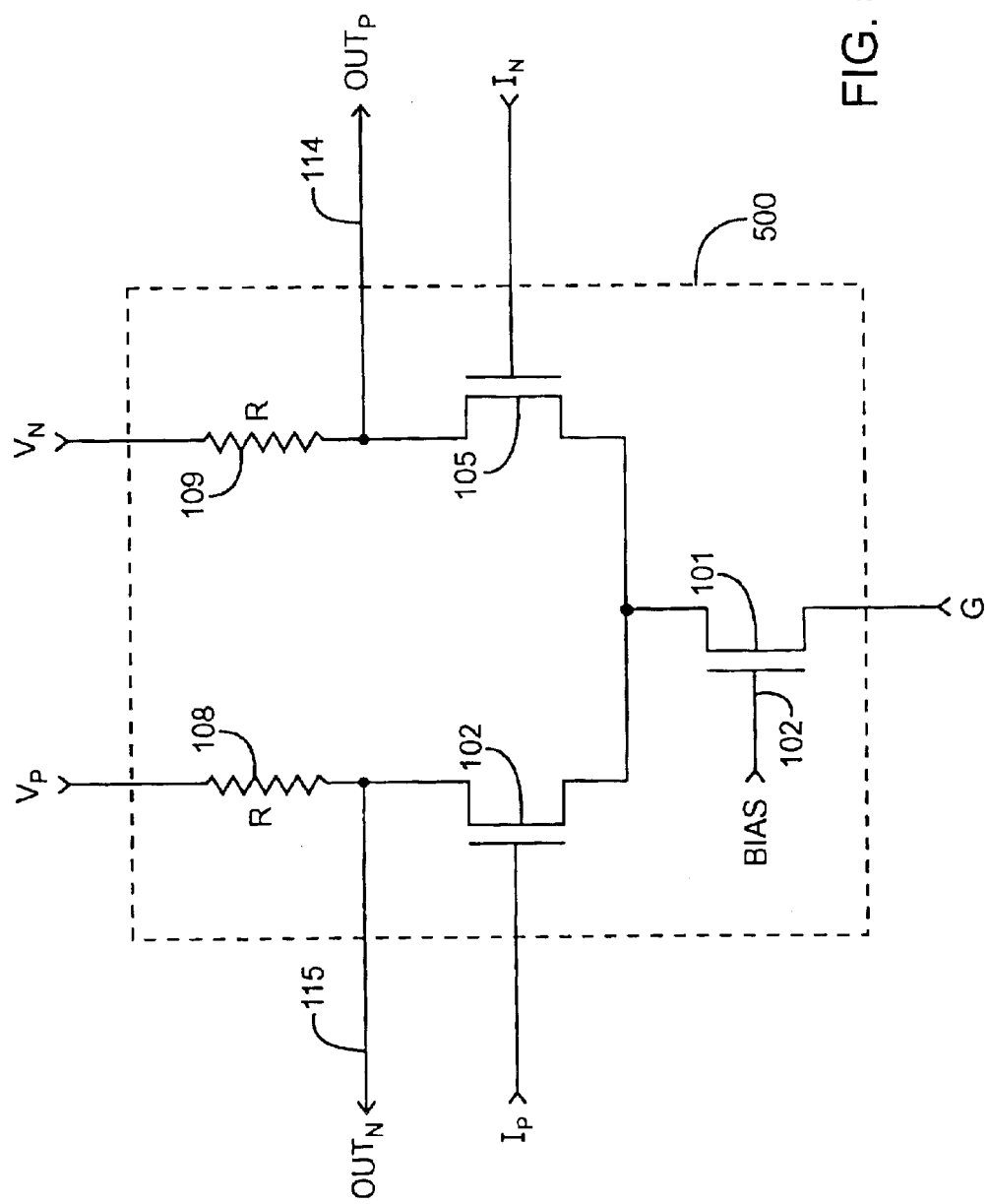
FIG. 5 illustrates a standard current-controlled CMOS logic building block circuitry included in stages of the multi-stage amplifier according to the present invention.

FIG. 5 illustrates standard current-controlled CMOS logic building block circuitry 500 included in each stage of the multi-stage amplifier according to the present invention. Thus, the various combinations of series peaking inductors, shunt peaking inductors, and miller cancellation capacitors can be added to the standard current-controlled CMOS logic building block circuitry 500 common to all amplifier stages according to the present invention.

Figure 6:
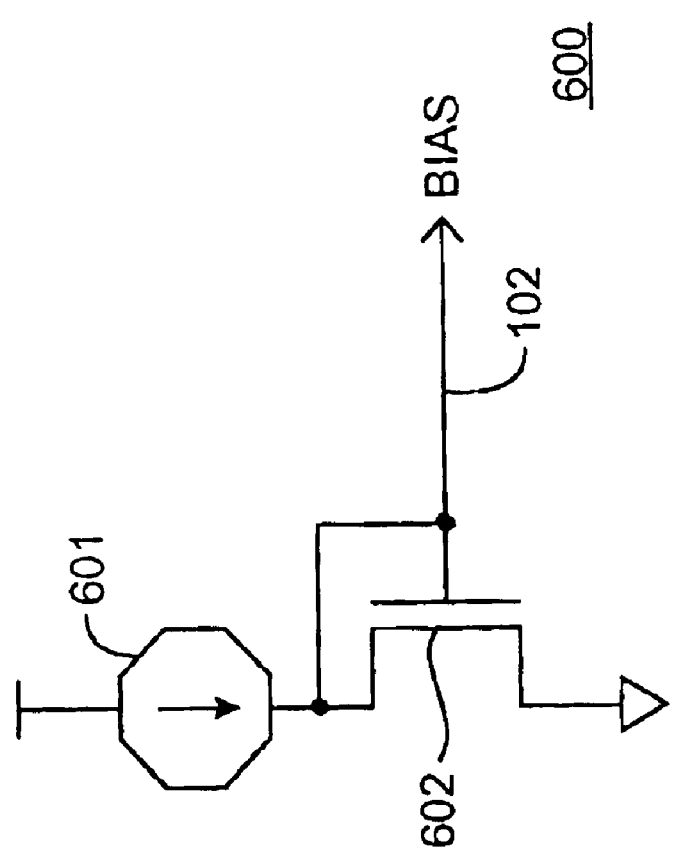
FIG. 6 illustrates a bias voltage generation circuit suitable for use in the various amplifier stages according to the present invention.

FIG. 6 illustrates a bias voltage generation circuit 600 suitable for use in the various amplifier stages according to the present invention. A current source 601 drives a current through a current mirror transistor 602. The gate and drain of the current mirror transistor 602 are tied together so that the bias voltage BIAS 102 biases the gate of the current mirror transistor 602 so that it can mirror the current from the current source 601. If the bias voltage BIAS 102 is circulated to one or more other stages of the multi-stage amplifier and if the current source transistor 101 in the stage to which the bias voltage BIAS 102 is routed is the same size as the current mirror transistor 602, then the same current will flow through both the current mirror transistor 602 and the current source transistor 101. If the current source transistor 101 and current mirror transistor 602 are not the same size in terms of their transistor width/length values, then the currents flowing through the two transistors will be proportional to their transistor width/length ratio.

FIG. 7 illustrates a multi-stage amplifier 700 according to the present invention having series peaking, shunt peaking, and miller capacitance cancellation in various combinations and at various stages in the multi-stage amplifier 700. The multi-stage amplifier 700 includes six stages 701, 702, 703, 704, 705, and 706 all of which include the standard current-controlled CMOS logic building block circuitry 500. The first amplifier stage 701 includes first and second series peaking inductors 711 and 712, first and second shunt peaking inductors 713 and 714, and first and second miller capacitance cancellation capacitors 715 and 716. Thus, the first amplifier stage 701 includes series peaking, shunt peaking, and miller capacitance cancellation all in the same stage 701. The second amplifier stage 702 includes first and second series peaking inductors 721 and 722 and first and second shunt peaking inductors 723 and 724. Thus, the second amplifier stage 702 includes series peaking and shunt peaking in the same stage 702. The third amplifier stage 703 includes first and second shunt peaking inductors 733 and 734 and first and second miller capacitance cancellation capacitors 735 and 736. Thus, the third amplifier stage 703 includes shunt peaking and miller capacitance cancellation in the same stage 703. The fourth amplifier stage 704 includes first and second series peaking inductors 741 and 742 and first and second miller capacitance cancellation capacitors 745 and 746. Thus, the fourth amplifier stage 704 includes series peaking and miller capacitance cancellation in the same stage 704. The fifth amplifier stage 705 includes first and second shunt peaking inductors 753 and 754, and therefore the first amplifier stage 705 has shunt peaking without either series peaking or miller capacitance cancellation. The last amplifier stage 706 has neither series peaking, shunt peaking, nor miller capacitance cancellation.

The multi-stage amplifier 700 illustrated in FIG. 7 is implemented on a signal integrated circuit. Therefore, the positive signal input 750 is received through an input pad 754, the negative signal input 751 is received through an input pad 755, the positive signal output 752 is driven out through output pad 756, and the positive signal output 753 is driven out through output pad 757.

Shunt peaking increases the bandwidth of a single stage, and therefore also increases the bandwidth of the multi-stage amplifier in which the single stage is present. Shunt peaking creates a peak in the gain of the amplifier toward the high end of the spectrum; however, there is an unavoidable roll off of the transfer function at the high end of the spectrum, and it is also undesirable to make the peak too high because it causes distortion.

With series peaking, the peak frequency $f_{series}$ is given by the following equation for an ideal inductor and capacitor.

$$f_{series} = \frac{1}{2\pi\sqrt{LC}}$$

Depending upon the Q of the real inductor and capacitor, the frequency response of the series peaking stage is similar to the shunt peaking frequency response.

By selection of the proper series inductor, the peaking frequency of the series peaking stage can be chosen so as to peak just above the roll off frequency of all the preceding stages. If the roll off frequency of the preceding stages is, e.g., 8 gigahertz, then peaking frequency of the next series peaking stage is chosen to be above 8 gigahertz, so that the frequency response of the multi-stage amplifier ending in series peaking stage is fairly flat, and so that the roll off frequency of the multi-stage amplifier is around, e.g., 10 gigahertz.

In order to increase the peaking frequency of the serial peaking stage, either the inductance of the inductor can be reduced, or alternatively the capacitance of the capacitor can be reduced. However, if the inductance of the inductor is reduced, the peaking level gets smaller, thereby reducing the ability to effectively compensate for roll off of the previous stages. However, by reducing the capacitance of the capacitor, the serial peaking of the gain is increased, and also the frequency of the serial peaking is increased.

There is a parasitic Miller capacitance from gate to drain of a CMOS transistor. cross-coupled capacitors are included in the circuit stage according to the present invention in order to cancel the Miller capacitances.

Thus, according to one embodiment of the present invention, serial peaking, shunt peaking, and Miller cancellation are combined. The combination according to the present invention results in a flat response to a higher roll off frequency than with conventional wide band data amplifiers, and also there is low distortion of the phase. For a linear system, it is desirable to have the same delay for all frequencies, in order to facilitate proper signal recovery. The phase is a function of the delay and is given by the following equation.

$$\phi=2\pi f \Delta t$$

Therefore, if every frequency component incurs the same delay through the amplifier, then the phase will be different for each frequency, but the phase will be linearly proportional to the frequency. Distortion of the phase results when there is a different delay for each frequency, thus phase is not linearly related to frequency.

The present invention is applicable to any wideband application, such as a SONET application.

Figure 8:
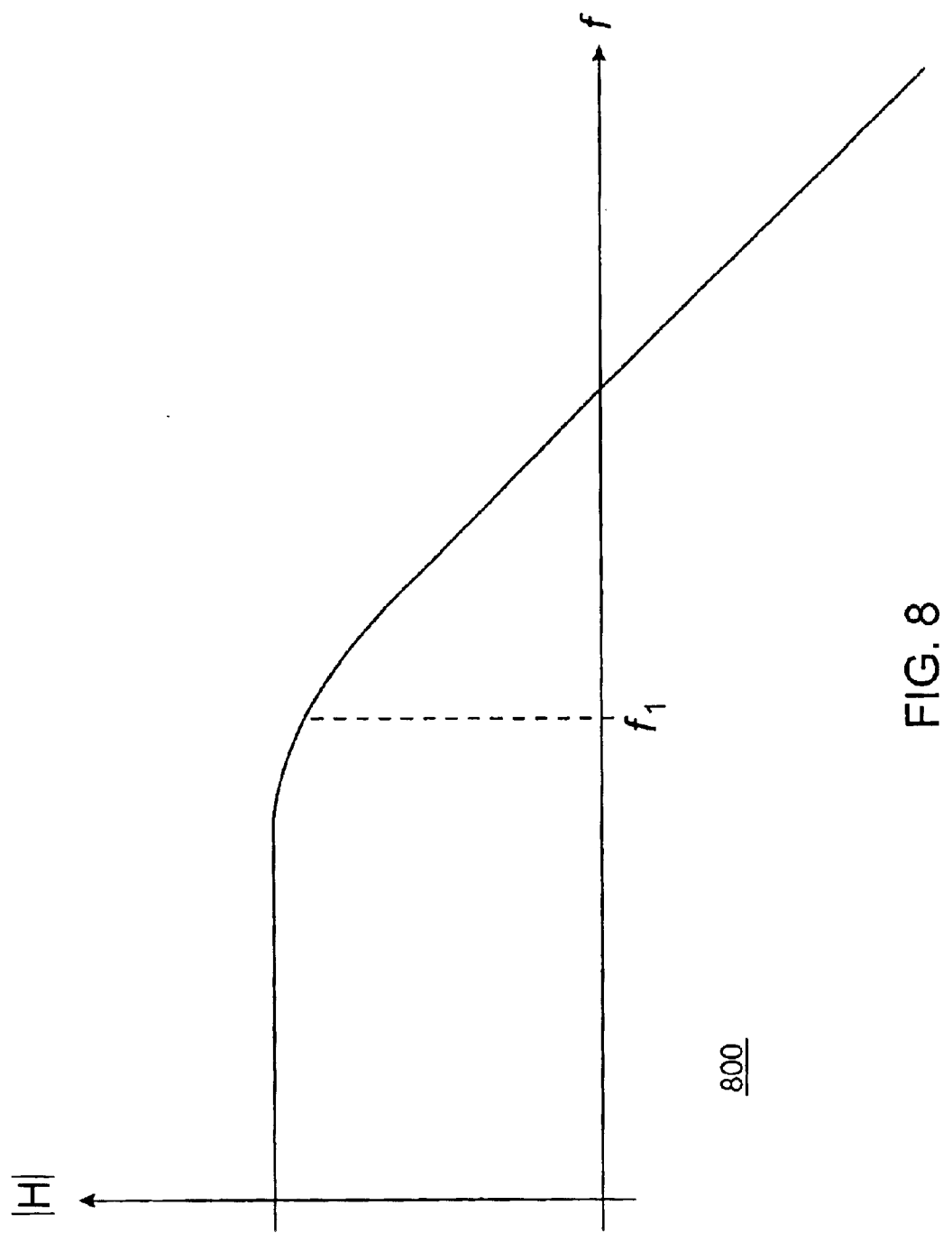
FIG. 8 illustrates the magnitude of the transfer function versus frequency of a multi-stage amplifier through a certain number of stages less than the total number of stages of the multi-stage amplifier in which the cutoff frequency through the certain number of stages is less than required for the multi-stage amplifier.
Figure 9:
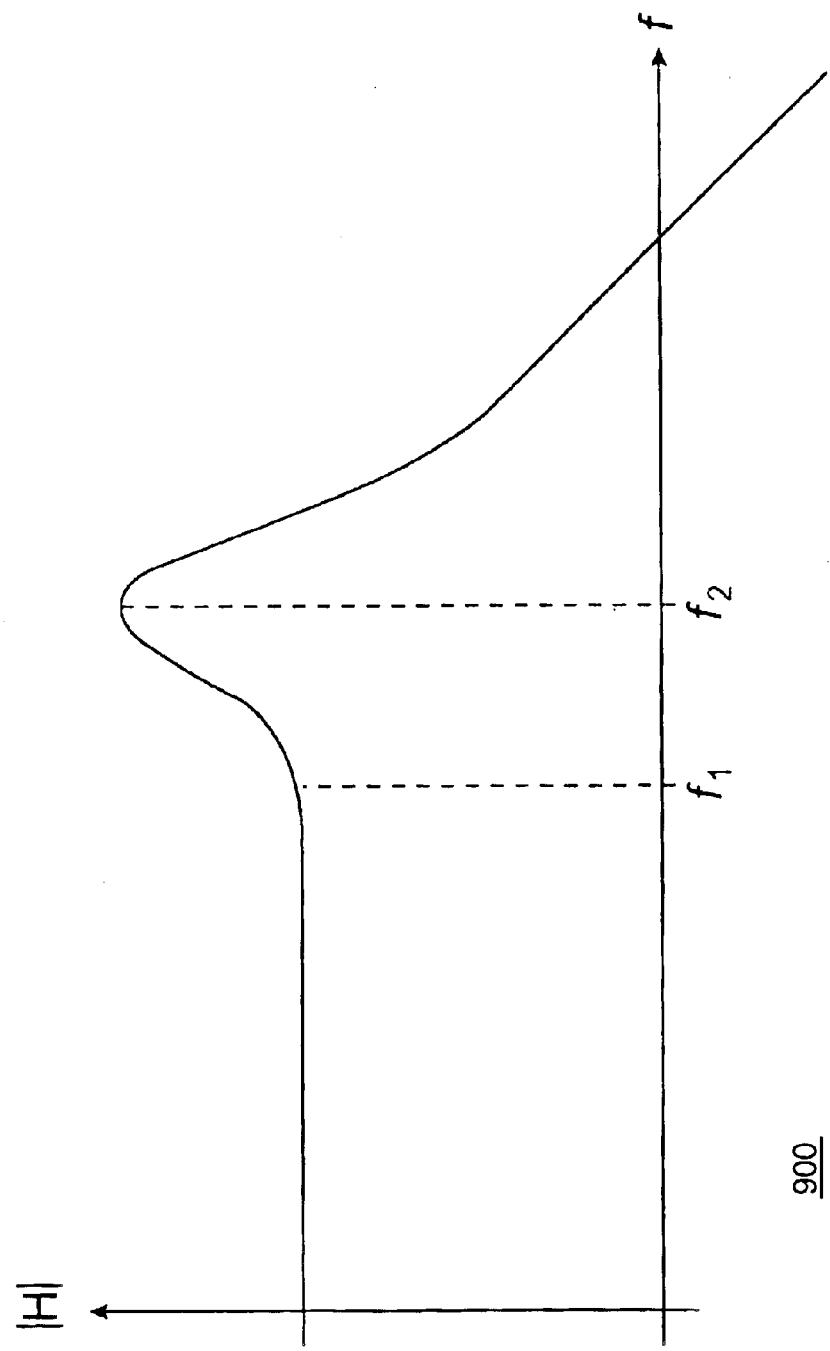
FIG. 9 illustrates the magnitude of the transfer function versus frequency of an amplifier stage having shunt peaking inductors creating a response peak above the cutoff frequency of the certain number of stages for which the magnitude of the transfer function versus frequency is illustrated in FIG. 8.
Figure 10:
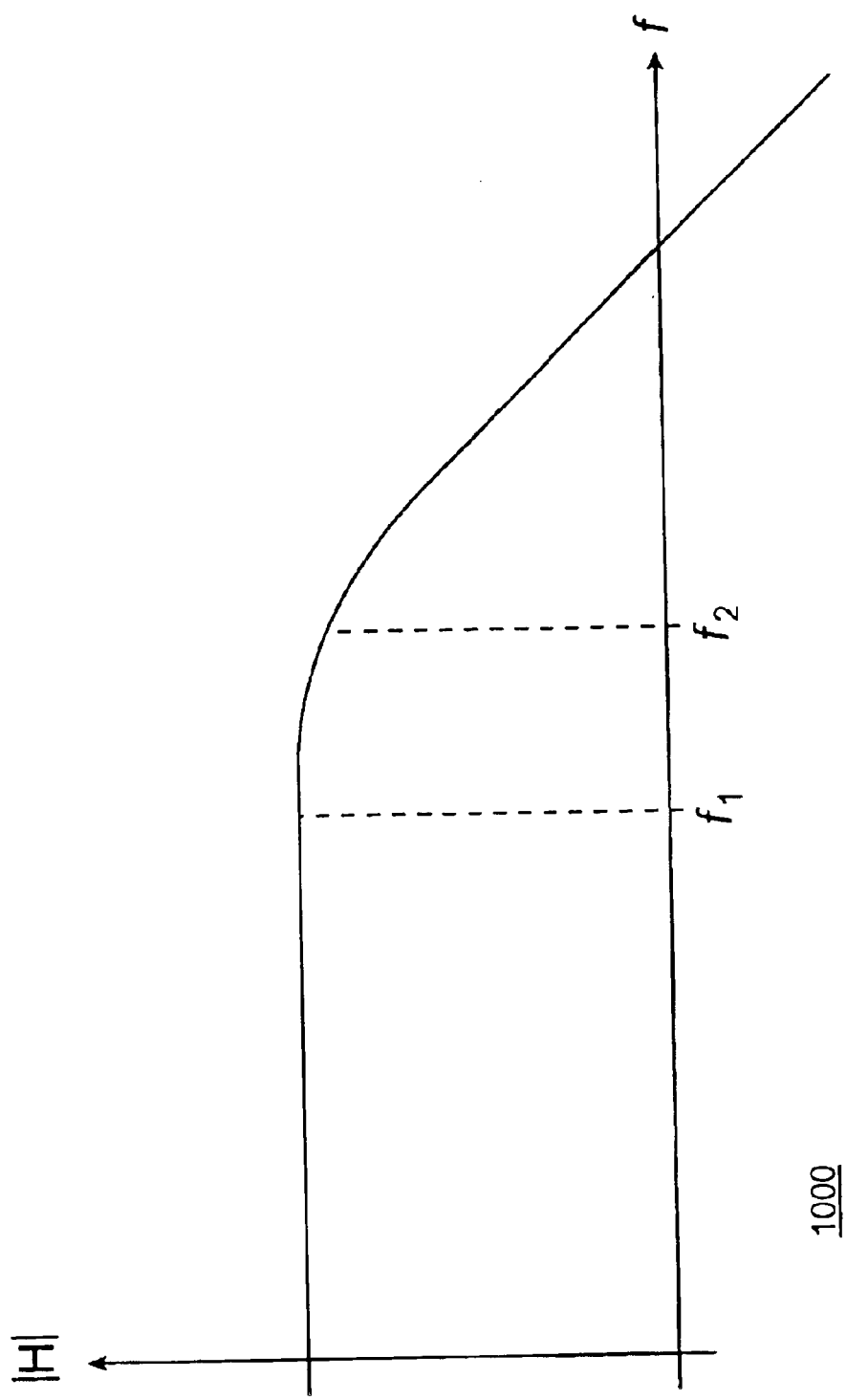
FIG. 10 illustrates the magnitude of the transfer function versus frequency of a multi-stage amplifier having the amplifier stage with shunt peaking for which the magnitude of the transfer function versus frequency is illustrated in FIG. 9 subsequent to the certain number of stages for which the magnitude of the transfer function versus frequency is illustrated in FIG. 8.
Figure 11:
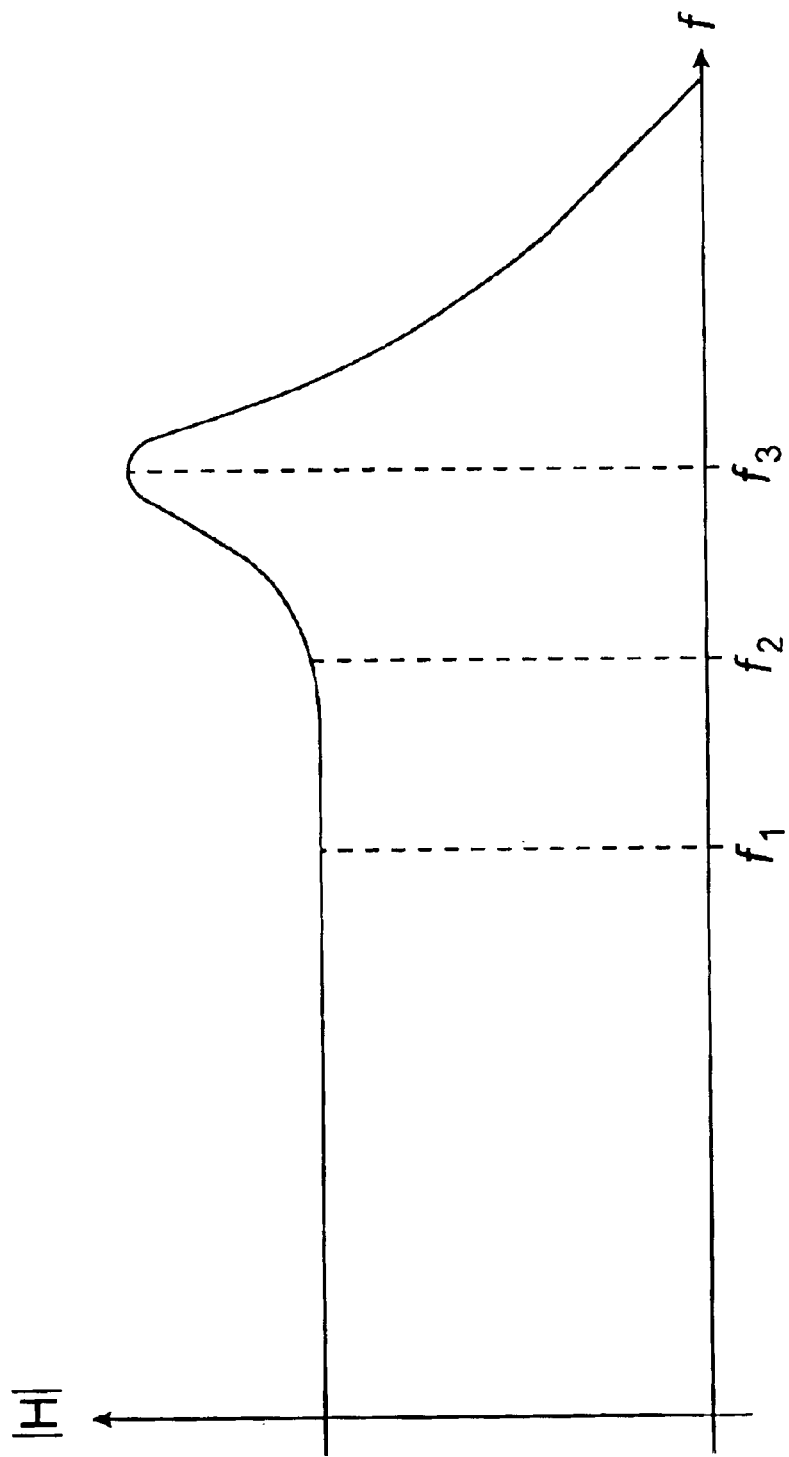
FIG. 11 illustrates the magnitude of the transfer function versus frequency of an amplifier stage having series peaking inductors creating a response peak above the cutoff frequency of the multi-stage amplifier for with the magnitude of the transfer function versus frequency is illustrated in FIG. 10.
Figure 12:
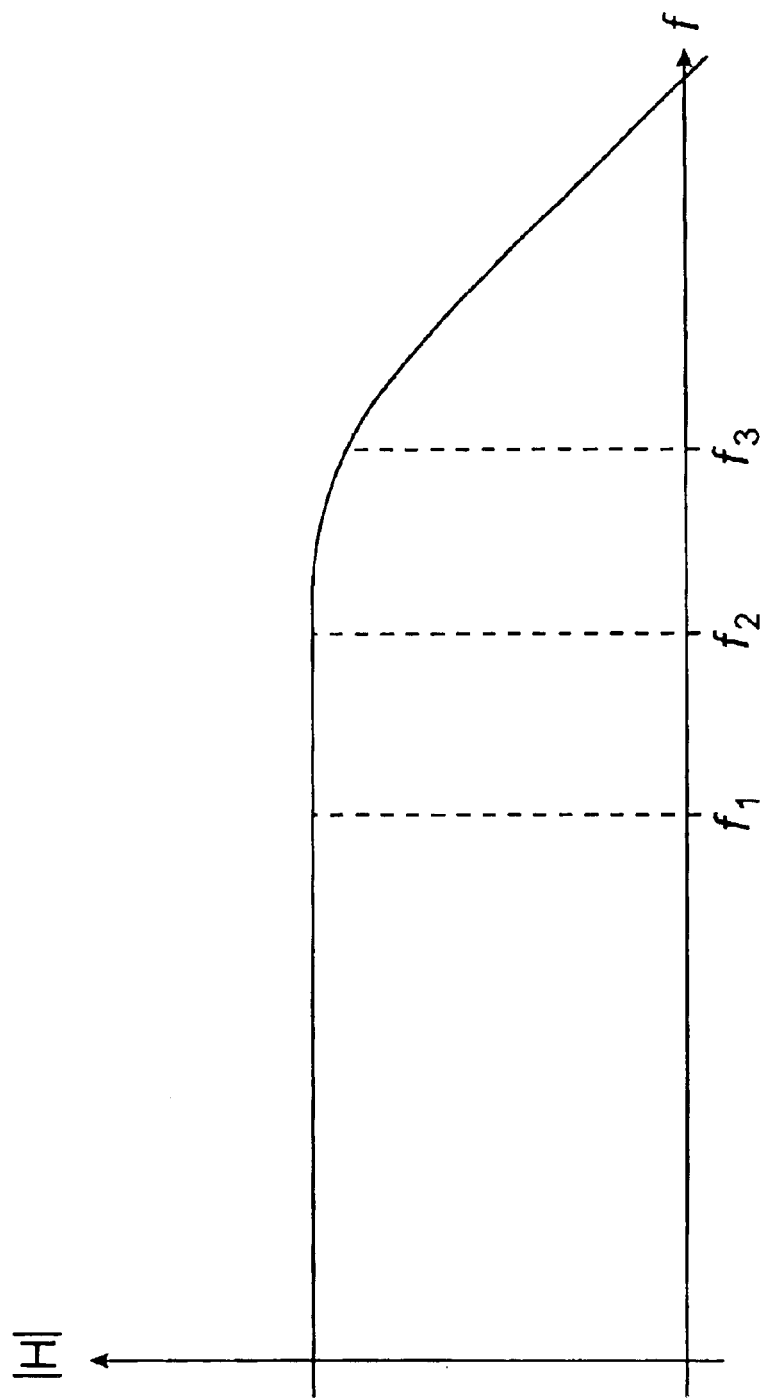
FIG. 12 illustrates the magnitude of the transfer function versus frequency of a multi-stage amplifier having the amplifier stage with series peaking for which the magnitude of the transfer function versus frequency is illustrated in FIG. 11 subsequent to the multi-stage amplifier for which the magnitude of the transfer function versus frequency is illustrated in FIG. 10.

FIGS. 8 through 12 illustrate the magnitude of the transfer function H versus frequency (in other words, frequency response) of multi-stage amplifiers and single stages at various positions. For example, FIG. 8 is an exemplary plot of the magnitude of the transfer function versus frequency of the first two stages 701 and 702 shown in FIG. 7 from the signal inputs 750 and 751 to the intermediate signal nodes 760 and 761. FIG. 9 is an exemplary plot of the magnitude of the transfer function versus frequency of the stage 703 illustrated in FIG. 7 from the intermediate signal nodes 760 and 761 to the intermediate signal nodes 770 and 771. FIG. 10 is an exemplary plot of the magnitude of the transfer function versus frequency of the first three amplifier stages 701, 702, and 703 illustrated in FIG. 7 from the signal inputs 750 and 751 to the intermediate signal nodes 770 and 771. FIG. 11 is an exemplary plot of the magnitude of the transfer function versus frequency of the fourth amplifier stage 704 illustrated in FIG. 7 from the intermediate signal nodes 770 and 771 to the intermediate signal nodes 780 and 781. FIG. 12 is an exemplary plot of the magnitude of the transfer function versus frequency of the first four amplifier stages 701, 702, 703, and 704 illustrated in FIG. 7 from the signal inputs 750 and 751 to the intermediate signal nodes 780 and 781. The plots shown in FIGS. 8 through 12 are not necessarily to scale and are approximate graphical representation of the actual frequency responses. In some instances, the shunt peaking in one stage may only extend its bandwidth without a peaking effect.

FIG. 8 illustrates the magnitude of the transfer function versus frequency 800 of a multi-stage amplifier through a certain number of stages less than the total number of stages of the multi-stage amplifier. In this amplifier the cutoff frequency through the certain number of stages is less than required for the multi-stage amplifier, or otherwise it affects the amplifier from achieving the required overall bandwidth. The logarithm of the magnitude of the output signal voltage amplitude to the input signal voltage amplitude ratio is plotted on the y-axis versus the logarithm of the frequency f of the input signal on the x-axis. The cut off frequency $f_1$ is the frequency at which roll off begins to occur.

FIG. 9 illustrates the magnitude of the transfer function versus frequency 900 of an amplifier stage having shunt peaking inductors creating a response peak above the cutoff frequency of the certain number of stages for which the magnitude of the transfer function versus frequency is illustrated in FIG. 8. The logarithm of the magnitude of the output signal voltage amplitude to the input signal voltage amplitude ratio is plotted on the y-axis versus the logarithm of the frequency f of the input signal on the x-axis. The cutoff frequency $f_1$ of the multi-stage amplifier through a certain number of amplifier stages less than the total number of stages is shown on FIG. 9 for reference. The amplifier stage for which the magnitude of the transfer function versus frequency 900 is plotted in FIG. 9 is designed such that the peaking frequency $f_2$ resulting from the shunt peaking inductors is higher than the cutoff frequency $f_1$, or in other cases the overall cutoff frequency is not far lower than $f_1$ due to the bandwidth expansion from shunt peaking.

FIG. 10 illustrates the magnitude of the transfer function versus frequency 1000 of a multi-stage amplifier having the amplifier stage with shunt peaking for which the magnitude of the transfer function versus frequency is illustrated in FIG. 9 subsequent to the certain number of stages for which the magnitude of the transfer function versus frequency is illustrated in FIG. 8. The shunt peaking at frequency $f_2$ for the amplifier stage for which the magnitude of the transfer function versus frequency is illustrated in FIG. 9 compensates between the frequencies of $f_1$ and $f_2$ for the roll off in the frequency response that occurs at frequency $f_1$ illustrated in FIG. 8.

FIG. 11 illustrates the magnitude of the transfer function versus frequency 1100 of an amplifier stage having series peaking inductors creating a response peak at frequency $f_3$ above the cutoff frequency $f_2$ at which roll off begins of the magnitude of the transfer function versus frequency of the multi-stage amplifier for with the magnitude of the transfer function versus frequency is illustrated in FIG. 10. When the stage for which the magnitude of the transfer function versus frequency is illustrated in FIG. 11 is placed after the multi-stage amplifier for which the magnitude of the transfer function versus frequency is illustrated in FIG. 10, then the peaking that occurs at frequency $f_3$ will compensate for the roll off in response that occurs at frequency $f_2$ for the multi-stage amplifier illustrated in FIG. 10, as illustrated in FIG. 12.

FIG. 12 illustrates the magnitude of the transfer function versus frequency 1200 of a multi-stage amplifier having the amplifier stage with series peaking for which the magnitude of the transfer function versus frequency is illustrated in FIG. 11 subsequent to the multi-stage amplifier for which the magnitude of the transfer function versus frequency is illustrated in FIG. 10. The series peaking at frequency $f_3$ for the amplifier stage for which the magnitude of the transfer function versus frequency is illustrated in FIG. 11 compensates between the frequencies of $f_2$ and $f_3$ for the roll off in the frequency response that occurs at frequency $f_2$ illustrated in FIG. 10.

In the first stage, the bond wire inductance can be used to instantiate the series peaking inductance. In order to achieve a flat frequency response, the series peaking stage is used to extend the bandwidth resulting from several shunt peaking stages. The series peaking stage can effectively be used to achieve higher bandwidth towards the end of the amplifier. However, because the earlier stages in the amplifier preferably are primarily concerned with achieving high gain, they are unable to produce a high band width. The peaking frequency of the series peaking stages are easily adjustable by changing the inductor value in order to get a wide band width.

Preferably, the last stage has shunt peaking without anything else, perhaps with a fifty ohm output resistor. Because the first stage has bonding wire with an inherent inductance, series peaking is nearly necessary for the first stage. Because a rather certain level of noise is injected into all the signals at all stages, it is desirable to increase the gain as much as practicable in the early stages so that the signal-to-noise ratio is as high as possible throughout the amplifier. A certain noise power corrupts a smaller signal proportionately more than a larger signal. If the signal is smaller in the intermediate stages, noise corrupts the smaller signal, and the noise is amplified along with the signal later in the amplifier. Thus, by having most of the gain at the early stages, only the noise incurred in the early high gain stages is amplified, while the noise absorbed by the later lower gain stages is not amplified as much.

For noise reasons, it is desirable to realize high gain near the beginning of the amplifier, especially in the first stage of the amplifier. Therefore, the transistors in the first stage are fairly large in comparison to later stages. Miller cancellation is more easily accomplished in higher gain stages rather than in lower gain stages. The size of the capacitance required to cancel a given miller capacitance $C_{gd}$ is given below.

$$C = C_{gd}\frac{A+1}{A-1}$$

Where A is the gain of the stage. Thus, for example, if A is 1, no capacitor is large enough to cancel the miller capacitance. However, for very large gain, the cancellation capacitor is only incrementally larger than the miller capacitance.

The miller capacitance affect the output pole, so it is desirable to have the capacitor appear in a stage where the gain is fairly high. That way, the miller capacitance can be effectively canceled, and the output stage does not see that much capacitance. In the last stage, shunt peaking is used because the signal is limited, so the bandwidth does not matter too much. In addition, it is desirable to avoid ringing on the output. With shunt peaking, it is possible to make a fairly linear phase characteristic, but the bandwidth can still be extended. The driver stage also uses a lot of current because it typically drives a relatively low impedance, so the bandwidth is generally not a big problem. The last stage typically drives out of the integrated circuit and into another device.

The multi-stage amplifier according to the present invention is implemented with multiple stages primarily for gain purposes, although the signal is typically increased in strength somewhat as well. For example, the signal coming into the chip may be on the order of 10 millivolts, while it is desirable to drive the signal out at 500 millivolts.

In series peaking, the signal is taken at the gate of the transistor, the point in series with the inductor and the parasitic capacitor. In addition, there is a parasitic capacitor between the positive power supply and the output signal, which is termed the shunt capacitor. In shunt peaking, the output signal is taken from the parallel combination of the parasitic shunt capacitor and the inductor resistor output path from the power supply to the output signal.

While the present invention has been described with reference to its presently preferred and alternative embodiments, those embodiments are offered by way of example, not by way of limitation. Those skilled in the art will be enabled by this disclosure to make various modifications and additions to the embodiments described herein without departing from the spirit and scope of the present invention. Accordingly, those various modifications and additions are deemed to lie within the scope of present invention as delineated by the following appended claims.

What is claimed is:

1. An amplifier stage, comprising:
   a current source;
   a first differential transistor having a source, gate, and drain, wherein the source of the first differential transistor is coupled to the current source;
   a second differential transistor having a source, gate, and drain, wherein the source of the second differential transistor is coupled to the current source;
   a first output impedance having positive and negative ends, wherein the negative end of the first output impedance is coupled to the drain of the first differential transistor and wherein the first output impedance includes a first shunt peaking inductor;
   a second output impedance having positive and negative ends, wherein the negative end of the second output impedance is coupled to the drain of the second differential transistor and wherein the second output impedance includes a second shunt peaking inductor;
   a first miller capacitance cancellation capacitor having a positive and negative ends, wherein the positive end of the first miller capacitance cancellation capacitor is coupled to the drain of the second differential transistor, and wherein the negative end of the first miller capacitance cancellation capacitor is coupled to the gate of the first differential transistor; and
   a second miller capacitance cancellation capacitor having a positive and negative ends, wherein the positive end of the second miller capacitance cancellation capacitor is coupled to the drain of the first differential transistor, and wherein the negative end of the second miller capacitance cancellation capacitor is coupled to the gate of the second differential transistor.

2. The amplifier stage of claim 1, wherein:
   the first output impedance includes a first output resistor connected in series with the first shunt inductor; and
   the second output impedance includes a second output resistor connected in series with the second shunt inductor.

3. The amplifier stage of claim 1, wherein:
   the current source comprises a current source transistor having a gate, source, and drain; and
   the gate of the current source transistor is coupled to a bias voltage.

4. The amplifier stage of claim 3, wherein:
   the first and second differential transistors and the current source transistor comprise NMOS transistors or PMOS transistors.

5. The amplifier stage of claim 1, wherein:
   the positive end of the first output impedance is coupled to a voltage supply; and
   the positive end of the second output impedance is coupled to the voltage supply.

6. An amplifier stage, comprising:
   a current source;
   a first differential transistor having a source, gate, and drain, wherein the source of the first differential transistor is coupled to the current source;

a second differential transistor having a source, gate, and drain, wherein the source of the second differential transistor is coupled to the current source;

a first series peaking inductor having positive and negative ends, wherein the negative end of the first series peaking inductor is coupled to the gate of the first differential transistor;

a second series peaking inductor having positive and negative ends, wherein the negative end of the second series peaking inductor is coupled to the gate of the second differential transistor;

a first miller capacitance cancellation capacitor having positive and negative ends, wherein the positive end of the first miller capacitance cancellation capacitor is coupled to the drain of the second differential transistor, and wherein the negative end of the first miller capacitance cancellation capacitor is coupled to the gate of the first differential transistor; and a second miller capacitance cancellation capacitor having positive and negative ends, wherein the positive end of the second miller capacitance cancellation capacitor is coupled to the drain of the first differential transistor, and wherein the negative end of the second miller capacitance cancellation capacitor is coupled to the gate of the second differential transistor.

7. The amplifier stage of claim 6, wherein:

the current source comprises a current source transistor having a gate, source, and drain; and the gate of the current source transistor is coupled to a bias voltage.

8. The amplifier stage of claim 7, wherein:

the first and second differential transistors and the current source transistor comprise NMOS transistors.

9. The amplifier stage of claim 7, wherein:

the first and second differential transistors and the current source transistor comprise PMOS transistors.

10. An amplifier stage, comprising:

a current source;

a first differential transistor having a source, gate, and drain, wherein the source of the first differential transistor is coupled to the current source;

a second differential transistor having a source, gate, and drain, wherein the source of the second differential transistor is coupled to the current source;

a first output resistor having positive and negative ends, wherein the negative end of the first output resistor is coupled to the drain of the first differential transistor;

a second output resistor having positive and negative ends, wherein the negative end of the second output resistor is coupled to the drain of the second differential transistor;

a first shunt peaking inductor having positive and negative ends, wherein the negative end of the first shunt peaking inductor is coupled to the positive end of the first output resistor;

a second shunt peaking inductor having positive and negative ends, wherein the negative end of the second shunt peaking inductor is coupled to the positive end of the second output resistor;

a first miller capacitance cancellation capacitor having positive and negative ends, wherein the positive end of the first miller capacitance cancellation capacitor is coupled to the drain of the second differential transistor, and wherein the negative end of the first miller capacitance cancellation capacitor is coupled to the gate of the first differential transistor; and a second miller capacitance cancellation capacitor having positive and negative ends, wherein the positive end of the second miller capacitance cancellation capacitor is coupled to the drain of the first differential transistor, and wherein the negative end of the second miller capacitance cancellation capacitor is coupled to the gate of the second differential transistor.

11. The amplifier stage of claim 10, wherein:

the current source comprises a current source transistor having a gate, source, and drain; and the gate of the current source transistor is coupled to a bias voltage.

12. The amplifier stage of claim 11, wherein:

the first and second differential transistors and the current source transistor comprise NMOS transistors.

13. The amplifier stage of claim 11, wherein:

the first and second differential transistors and the current source transistor comprise PMOS transistors.

14. A multi-stage differential amplifier, comprising:

a first amplifier stage, that includes a first differential transistor having a first source, a first gate, and a first drain, and a second differential transistor having a second source, a second gate, and a second drain, having a positive signal input, a negative signal input, a positive signal output, and a negative signal output;

a second amplifier stage having a positive signal input, a negative signal input, a positive signal output, and a negative signal output;

wherein the positive signal output of the first amplifier stage is coupled to the positive signal input of the second amplifier stage, and wherein the negative signal output of the first amplifier stage is coupled to the negative signal input of the second amplifier stage;

wherein the first amplifier stage includes a first pair of series peaking inductors, a first pair of shunt peaking inductors, and a first pair of miller capacitance cancellation capacitors; and wherein a first miller capacitance cancellation capacitor, of the first pair of miller capacitance cancellation capacitors, having positive and negative ends, wherein the positive end of the first miller capacitance cancellation capacitor is coupled to the second drain of the second differential transistor, and wherein the negative end of the first miller capacitance cancellation capacitor is coupled to the first gate of the first differential transistor;

wherein a second miller capacitance cancellation capacitor, of the first pair of miller capacitance cancellation capacitors, having positive and negative ends, wherein the positive end of the second miller capacitance cancellation capacitor is coupled to the first drain of the first differential transistor, and wherein the negative end of the second miller capacitance cancellation capacitor is coupled to the second gate of the second differential transistor;

wherein the second amplifier stage includes a second pair of series peaking inductors and a second pair of shunt peaking inductors.

15. The multi-stage differential amplifier of claim 14, further comprising:

a third amplifier stage having a positive signal input, a negative signal input, a positive signal output, and a negative signal output;

wherein the positive signal output of the second amplifier stage is coupled to the positive signal input of the third amplifier stage, and wherein the negative signal output of the second amplifier stage is coupled to the negative signal input of the third amplifier stage; and wherein the third amplifier stage includes a third pair of series peaking inductors, a third pair of shunt peaking inductors, and a second pair of miller capacitance cancellation capacitors.

16. The multi-stage differential amplifier of claim 15, further comprising:

a fourth amplifier stage having a positive signal input, a negative signal input, a positive signal output, and a negative signal output;

wherein the positive signal output of the third amplifier stage is coupled to the positive signal input of the fourth amplifier stage, and wherein the negative signal output of the third amplifier stage is coupled to the negative signal input of the fourth amplifier stage; and wherein the fourth amplifier stage includes a fourth pair of series peaking inductors and a third pair of miller capacitance cancellation capacitors.

17. The multi-stage differential amplifier of claim 16, further comprising:

a fifth amplifier stage having a positive signal input, a negative signal input, a positive signal output, and a negative signal output;

wherein the positive signal output of the fourth amplifier stage is coupled to the positive signal input of the fifth amplifier stage, and wherein the negative signal output of the fourth amplifier stage is coupled to the negative signal input of the fifth amplifier stage; and wherein the fifth amplifier stage includes a fourth third pair of shunt peaking inductors.

18. The multi-stage differential amplifier of claim 17, further comprising:

a sixth amplifier stage having a positive signal input, a negative signal input, a positive signal output, and a negative signal output;

wherein the positive signal output of the fifth amplifier stage is coupled to the positive signal input of the sixth amplifier stage, and wherein the negative signal output of the fifth amplifier stage is coupled to the negative signal input of the sixth amplifier stage.

19. The multi-stage differential amplifier of claim 14, wherein:

each shunt peaking inductor of the first pair of shunt peaking inductors is coupled in series with a corresponding output resistor.

20. The multi-stage differential amplifier of claim 14, wherein:

each shunt peaking inductor of the second pair of shunt peaking inductors is coupled in series with a corresponding output resistor.

21. The multi-stage differential amplifier of claim 14, wherein:

at least one of the first amplifier stage and the second amplifier stage includes:
a current source;
a first differential transistor having a source, gate, and drain, wherein the source of the first differential transistor is coupled to the current source; and
a second differential transistor having a source, gate, and drain, wherein the source of the second differential transistor is coupled to the current source.

22. The multi-stage differential amplifier of claim 21, wherein:

the current source comprises a current source transistor having a gate, source, and drain; and the gate of the current source transistor is coupled to a bias voltage.

23. The multi-stage differential amplifier of claim 22, wherein:

the first and second differential transistors and the current source transistor comprise NMOS transistors.

24. The multi-stage differential amplifier of claim 22, wherein:

the first and second differential transistors and the current source transistor comprise PMOS transistors.

25. A multi-stage differential amplifier, comprising:

a first amplifier stage, that includes a first differential transistor having a first source, a first gate, and a first drain, and a second differential transistor having a second source, a second gate, and a second drain, having a positive signal input, a negative signal input, a positive signal output, and a negative signal output;

a second amplifier stage having a positive signal input, a negative signal input, a positive signal output, and a negative signal output;

wherein the positive signal output of the first amplifier stage is coupled to the positive signal input of the second amplifier stage, and wherein the negative signal output of the first amplifier stage is coupled to the negative signal input of the second amplifier stage;

wherein the first amplifier stage includes a first pair of series peaking inductors, a first pair of shunt peaking inductors, and a first pair of miller capacitance cancellation capacitors;

wherein a first miller capacitance cancellation capacitor, of the first pair of miller capacitance cancellation capacitors, having positive and negative ends, wherein the positive end of the first miller capacitance cancellation capacitor is coupled to the second drain of the second differential transistor, and wherein the negative end of the first miller capacitance cancellation capacitor is coupled to the first gate of the first differential transistor;

wherein a second miller capacitance cancellation capacitor, of the first pair of miller capacitance cancellation capacitors, having positive and negative ends, wherein the positive end of the second miller capacitance cancellation capacitor is coupled to the first drain of the first differential transistor, and wherein the negative end of the second miller capacitance cancellation capacitor is coupled to the second gate of the second differential transistor;

wherein each shunt peaking inductor of the first pair of shunt peaking inductors is coupled in series with a corresponding output resistor;

wherein the second amplifier stage includes a second pair of series peaking inductors and a second pair of shunt peaking inductors;

wherein each shunt peaking inductor of the second pair of shunt peaking inductors is coupled in series with a corresponding output resistor;

a third amplifier stage having a positive signal input, a negative signal input, a positive signal output, and a negative signal output;

wherein the positive signal output of the second amplifier stage is coupled to the positive signal input of the third amplifier stage, and wherein the negative signal output of the second amplifier stage is coupled to the negative signal input of the third amplifier stage;

wherein the third amplifier stage includes a third pair of series peaking inductors, a third pair of shunt peaking inductors, and a second pair of miller capacitance cancellation capacitors; and wherein each shunt peaking inductor of the third pair of shunt peaking inductors is coupled in series with a corresponding output resistor.

26. The multi-stage differential amplifier of claim 25, wherein:

at least one of the first amplifier stage and the second amplifier stage includes:
 a current source;
 a first differential transistor having a source, gate, and drain, wherein the source of the first differential transistor is coupled to the current source; and
 a second differential transistor having a source, gate, and drain, wherein the source of the second differential transistor is coupled to the current source.

27. The multi-stage differential amplifier of claim 26, wherein:

the current source comprises a current source transistor having a gate, source, and drain; and the gate of the current source transistor is coupled to a bias voltage.

28. The multi-stage differential amplifier of claim 27, wherein:

the first and second differential transistors and the current source transistor comprise NMOS transistors.

29. The multi-stage differential amplifier of claim 27, wherein:

the first and second differential transistors and the current source transistor comprise PMOS transistors.

* * * * *

UNITED STATES PATENT AND TRADEMARK OFFICE
CERTIFICATE OF CORRECTION

| | | |
|---|---|---|
| PATENT NO. | : 7,109,799 B2 | Page 1 of 1 |
| APPLICATION NO. | : 10/618462 | |
| DATED | : September 19, 2006 | |
| INVENTOR(S) | : Guangming Yin et al. | |

It is certified that error appears in the above-identified patent and that said Letters Patent is hereby corrected as shown below:

Column 10, line 28, in Claim 1: after "having", delete "a"

Column 10, line 36, in Claim 1: before "positive", delete "a"

Signed and Sealed this

Twenty-ninth Day of July, 2008

JON W. DUDAS
*Director of the United States Patent and Trademark Office*